United States Patent
Shen et al.

(10) Patent No.: US 10,672,821 B2
(45) Date of Patent: Jun. 2, 2020

(54) SENSOR DEVICE AND MANUFACTURING METHOD THEREOF

(71) Applicant: Wuhan Xinxin Semiconductor Manufacturing Co., Ltd., Wuhan, Hubei Province (CN)

(72) Inventors: Liang Shen, Wuhan (CN); Wenjing Cheng, Wuhan (CN)

(73) Assignee: Wuhan Xinxin Semiconductor Manufacturing Co., Ltd., Wuhan, Hubei Province (CN)

(*) Notice: Subject to any disclaimer, the term of this patent is extended or adjusted under 35 U.S.C. 154(b) by 0 days.

(21) Appl. No.: 16/351,536

(22) Filed: Mar. 13, 2019

(65) Prior Publication Data

US 2020/0058696 A1 Feb. 20, 2020

(30) Foreign Application Priority Data

Aug. 14, 2018 (CN) .......................... 2018 1 0925015

(51) Int. Cl.
| | |
|---|---|
| *H01L 27/146* | (2006.01) |
| *H01L 23/00* | (2006.01) |
| *H01L 27/11573* | (2017.01) |
| *H01L 27/11582* | (2017.01) |

(52) U.S. Cl.
CPC ........ *H01L 27/14634* (2013.01); *H01L 24/32* (2013.01); *H01L 27/11573* (2013.01); *H01L 27/11582* (2013.01); *H01L 27/1469* (2013.01); *H01L 2924/1437* (2013.01)

(58) Field of Classification Search
CPC ......... H01L 27/14634; H01L 27/11573; H01L 27/11582; H01L 27/11551; H01L 27/11578; H01L 27/14609; H01L 27/1469; H01L 24/32; H01L 25/167; H01L 25/50
USPC ....... 257/431, 314, 292, 324, 326, 678, 686, 257/777, 786, E27.06, E27.026, E27.097, 257/E23.141, E29.255, E21.577, E21.597; 365/185.05, 185.11, 185.17; 438/16, 199, 438/455, 588, 598
See application file for complete search history.

(56) References Cited

U.S. PATENT DOCUMENTS

| | | | |
|---|---|---|---|
| 9,406,561 B2 * | 8/2016 | Farooq | H01L 21/76898 |
| 2003/0157748 A1 * | 8/2003 | Kim | H01L 21/76804 438/107 |
| 2019/0043836 A1 * | 2/2019 | Fastow | H01L 24/73 |
| 2019/0057903 A1 * | 2/2019 | Or-Bach | H01L 27/11206 |
| 2019/0057959 A1 * | 2/2019 | Or-Bach | H01L 21/8221 |

(Continued)

*Primary Examiner* — Dao H Nguyen
(74) *Attorney, Agent, or Firm* — Winston Hsu

(57) ABSTRACT

A sensor device includes a first wafer structure and a second wafer structure bonded to the first wafer structure. The first wafer structure includes a first substrate, an integrated circuit layer integrated with the first substrate, and a three-dimensional (3D) NAND memory cell array integrated with the integrate circuit layer. The integrated circuit layer and the 3D NAND memory cell array are located at the same side of the first substrate. The second wafer structure includes a second substrate and a sensing module of a sensor integrated with the second substrate. A manufacturing method of the sensor device includes bonding the second wafer structure to the first wafer structure. A side of the first wafer structure where the 3D NAND memory cell array is located is bonded to a side of the second wafer structure where the sensing module is located.

20 Claims, 4 Drawing Sheets

(56) References Cited

U.S. PATENT DOCUMENTS

2020/0006275 A1\* 1/2020 Chen .................. H01L 24/08
2020/0006284 A1\* 1/2020 Chen .................. H01L 24/27

\* cited by examiner

SENSOR DEVICE AND MANUFACTURING METHOD THEREOF

CROSS REFERENCE TO RELATED APPLICATION

The present application claims priority from China Patent application No. 201810925015.7, filed Aug. 14, 2018, the entire disclosure of which is incorporated herein by reference.

BACKGROUND OF THE INVENTION

1. Field of the Invention

The present disclosure relates to a sensor device and a manufacturing method thereof, and more particularly, to a sensor device and a manufacturing method thereof for increasing storage capacity.

2. Description of the Prior Art

Image sensors are devices capable of converting optical images into electrical signals and are widely used in various applications such as digital cameras and other optical electronic products. In recent years, complementary metal-oxide-semiconductor (CMOS) image sensor (hereinafter abbreviated as CIS) becomes a popular image sensing technology.

Generally, in the CIS device, a dynamic random access memory (DRAM) chip is stacked between a pixel chip and an image signal processing (ISP) chip for increasing the amount of storage cells in the CIS device. However, there are many problems about the approach mentioned above. Firstly, the manufacturing yield is low because three chips (the DRAM chip, the pixel chip, and the ISP chip) have to be stacked and bonded to one another by three-dimensional bonding processes. Secondly, the storage capacity of the DRAM chip is limited because the dimension of the DRAM chip has to be the same as the dimension of the pixel chip and the dimension of the ISP chip, and the demands for larger storage capacity and higher data processing speed cannot be satisfied accordingly.

SUMMARY OF THE INVENTION

A sensor device and a manufacturing method thereof are provided in the present disclosure. In the manufacturing method, a first wafer structure including an integrated circuit layer and a three-dimensional (3D) NAND memory cell array and a second wafer structure including a sensing module of a sensor are bonded to each other for increasing storage capacity of the sensor device and improving the manufacturing yield of the manufacturing method.

According to an embodiment of the present disclosure, a sensor device is provided. The sensor device includes a first wafer structure and a second wafer structure. The first wafer structure includes a first substrate, an integrated circuit layer, and a three-dimensional (3D) NAND memory cell array. The integrated circuit layer is integrated with the first substrate. The 3D NAND memory cell array is integrated with the integrate circuit layer. The integrated circuit layer and the 3D NAND memory cell array are located at the same side of the first substrate. The second wafer structure is bonded to the first wafer structure. The second wafer structure includes a second substrate and a sensing module of a sensor. The sensing module is integrated with the second substrate, and a side of the first wafer structure where the 3D NAND memory cell array is located is bonded to a side of the second wafer structure where the sensing module is located.

In some embodiments, the integrated circuit layer includes a logic control module of the sensor and a buffer memory module.

In some embodiments, the buffer memory module comprises a static random-access memory (SRAM) module.

In some embodiments, the logic control module of the sensor comprises an image signal processing (ISP) module.

In some embodiments, the integrated circuit layer further includes a peripheral circuit. The peripheral circuit and the 3D NAND memory cell array constitute a 3D NAND memory module.

In some embodiments, the sensor comprises a complementary metal-oxide-semiconductor (CMOS) image sensor (CIS).

In some embodiments, the sensing module comprises a pixel circuit module.

In some embodiments, a bonding interface between the first wafer structure and the second wafer structure comprises a surface of the 3D NAND memory cell array and a surface of the sensing module.

In some embodiments, the first substrate and the integrated circuit layer constitute a system-on-a-chip (SoC), and the 3D NAND memory cell array is disposed on the SoC.

According to an embodiment of the present disclosure, a manufacturing method of a sensor device is provided. The manufacturing method includes the following steps. A first wafer structure and a second wafer structure are provided. The first wafer structure includes a first substrate, an integrated circuit layer, and a three-dimensional (3D) NAND memory cell array. The integrated circuit layer is integrated with the first substrate. The 3D NAND memory cell array is integrated with the integrate circuit layer. The integrated circuit layer and the 3D NAND memory cell array are located at the same side of the first substrate. The second wafer structure includes a second substrate and a sensing module of a sensor. The sensing module is integrated with the second substrate. Subsequently, the second wafer structure is bonded to the first wafer structure. A side of the first wafer structure where the 3D NAND memory cell array is located is bonded to a side of the second wafer structure where the sensing module is located.

In some embodiments, the integrated circuit layer includes a logic control module of the sensor and a buffer memory module.

In some embodiments, the buffer memory module comprises a static random-access memory (SRAM) module.

In some embodiments, the logic control module of the sensor comprises an image signal processing (ISP) module.

In some embodiments, the integrated circuit layer further includes a peripheral circuit. The peripheral circuit and the 3D NAND memory cell array constitute a 3D NAND memory module.

In some embodiments, a manufacturing method of the first wafer structure includes the following steps. The first substrate is provided. The logic control module of the sensor, the buffer memory module, and the peripheral circuit are integrated to the first substrate for forming a system-on-a-chip (SoC). The first substrate and the integrated circuit layer constitute the SoC. The 3D NAND memory cell array is formed on the SoC by a semiconductor manufacturing process.

In some embodiments, a projection dimension of the SoC in a vertical direction is equal to a projection dimension of the sensing module of the sensor in the vertical direction.

In some embodiments, the sensor comprises a complementary metal-oxide-semiconductor (CMOS) image sensor (CIS).

In some embodiments, the sensing module comprises a pixel circuit module.

In some embodiments, a bonding interface between the first wafer structure and the second wafer structure comprises a surface of the 3D NAND memory cell array and a surface of the sensing module.

In some embodiments, the manufacturing method further includes performing a post treatment to the first wafer structure bonded with the second wafer structure for forming the sensor device. The post treatment includes a cutting process or a thinning process.

The manufacturing yield of the manufacturing process may be improved because only two wafer structures are required to be bonded for forming the sensor device. The SRAM module may be used to replace a DRAM memory module in a complementary metal-oxide-semiconductor (CMOS) image sensor (CIS) device formed by a three layers (chips) bonding method. The additional 3D NAND memory module may provide higher storage capacity for the sensor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
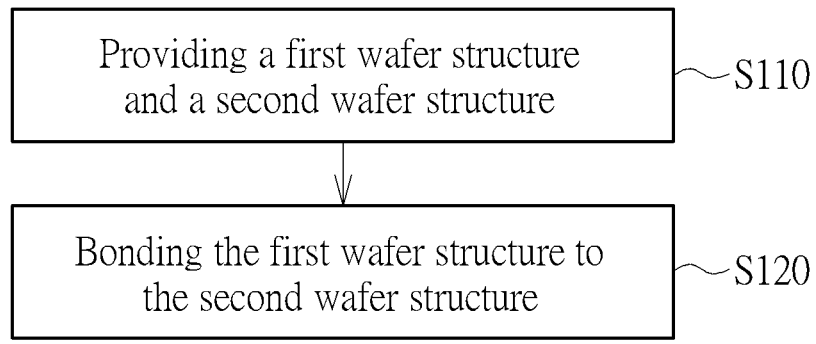
FIG. 1 is a flowchart of a manufacturing method of a sensor device according to a first embodiment of the present disclosure.
Figure 2:
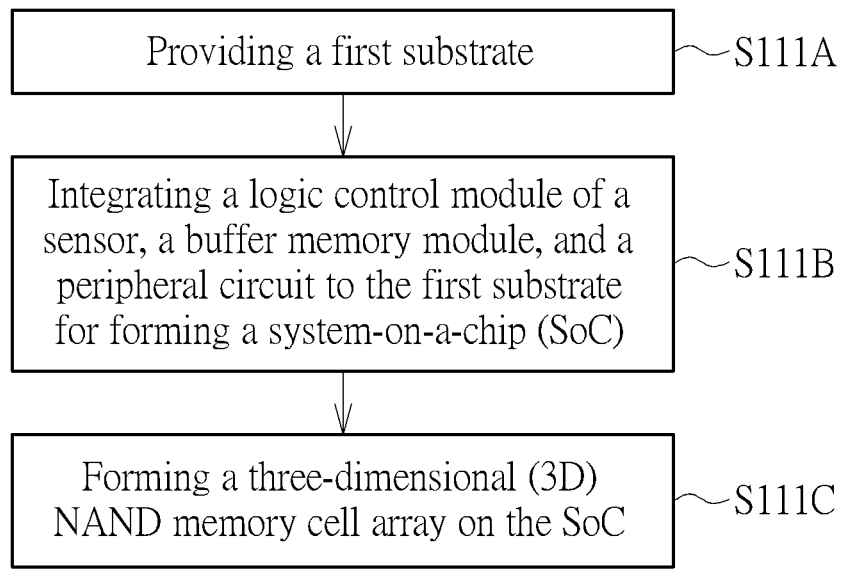
FIG. 2 is a flowchart of a manufacturing method of a first wafer structure according to an embodiment of the present disclosure.
Figure 3:
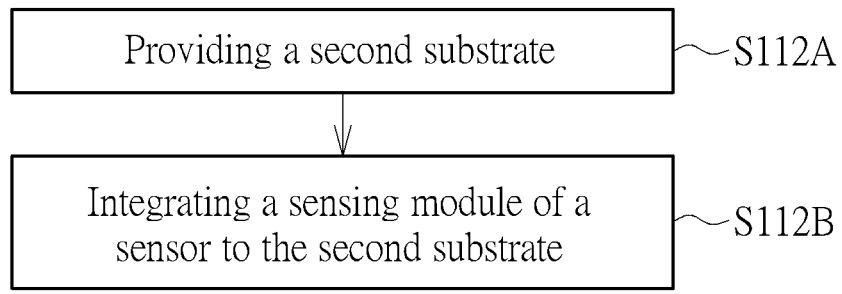
FIG. 3 is a flowchart of a manufacturing method of a second wafer structure according to an embodiment of the present disclosure.
Figure 4:
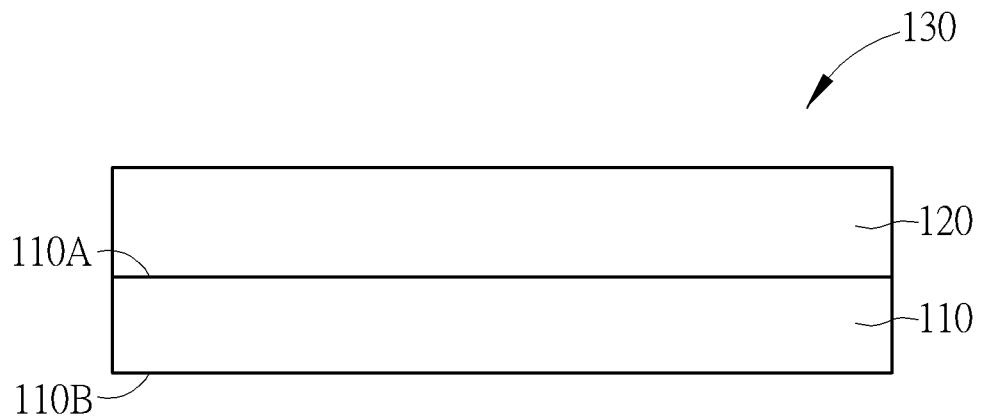
FIG. 4 is a schematic drawing illustrating a manufacturing method of a sensor device according to an embodiment of the present disclosure.
Figure 5:
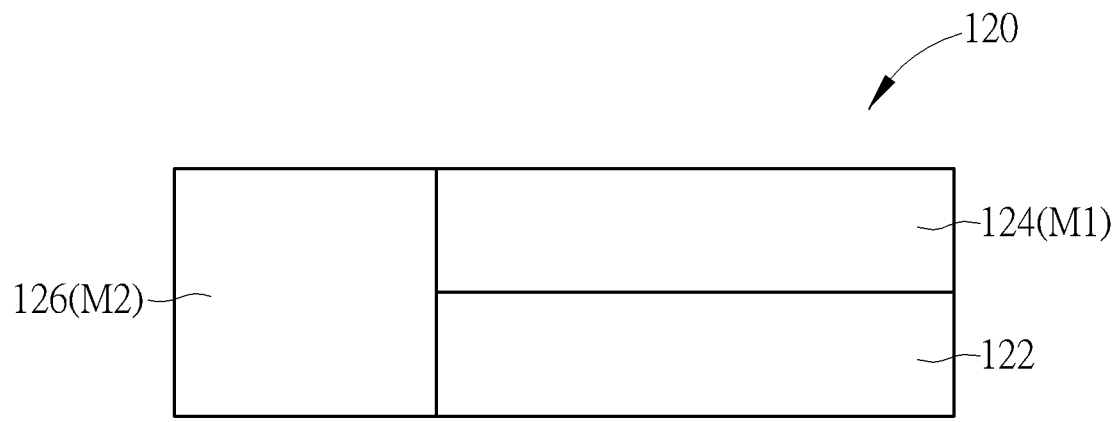
FIG. 5 is a schematic drawing illustrating an integrated circuit layer according to an embodiment of the present disclosure.
Figure 6:
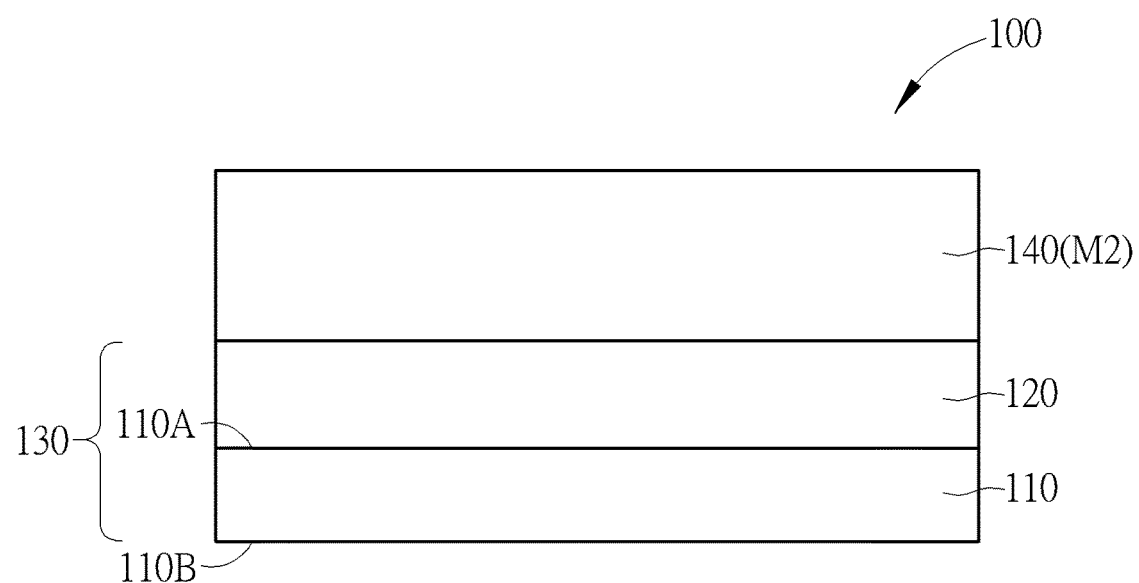
FIG. 6 is a schematic drawing in a step subsequent to FIG. 4.
Figure 7:
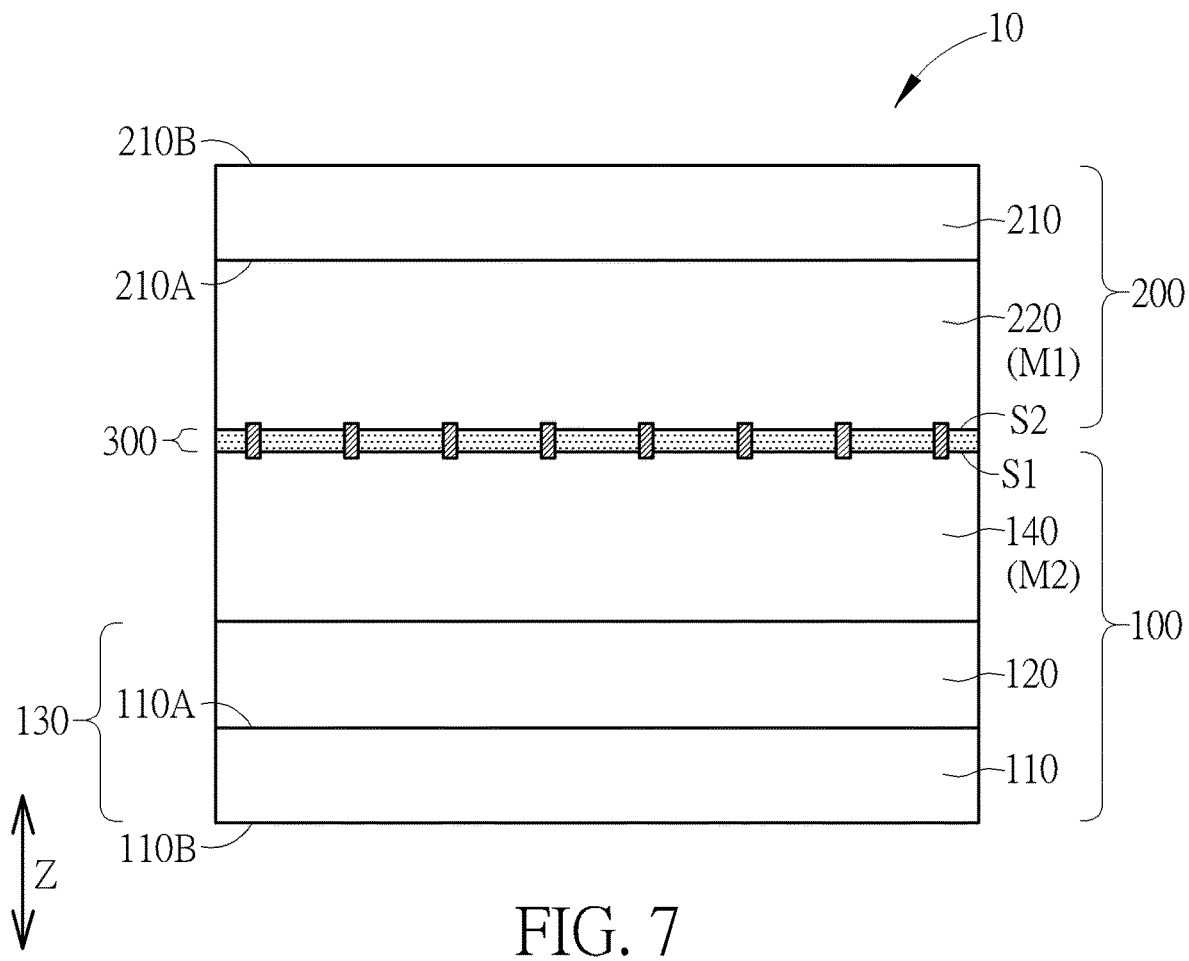
FIG. 7 is a schematic drawing in a step subsequent to FIG. 6.

Please refer to FIGS. 1-7. FIG. 1 is a flowchart of a manufacturing method of a sensor device according to a first embodiment of the present disclosure. FIG. 2 is a flowchart of a manufacturing method of a first wafer structure according to an embodiment of the present disclosure. FIG. 3 is a flowchart of a manufacturing method of a second wafer structure according to an embodiment of the present disclosure. FIGS. 4-7 are schematic drawings illustrating a manufacturing method of a sensor device according to an embodiment of the present disclosure. FIG. 5 is a schematic drawing illustrating an integrated circuit layer according to an embodiment of the present disclosure. FIG. 6 is a schematic drawing in a step subsequent to FIG. 4. FIG. 7 is a schematic drawing in a step subsequent to FIG. 6. A manufacturing method of a sensor device may include the following step.

As shown in FIG. 1 and FIG. 7, in step S110, a first wafer structure 100 and a second wafer structure 200 are provided. The first wafer structure 100 includes a first substrate 110, an integrated circuit layer 120, and a three-dimensional (3D) NAND memory cell array 140. The integrated circuit layer 120 is integrated with the first substrate 110. The 3D NAND memory cell array 140 is integrated with the integrate circuit layer 120. The integrated circuit layer 120 and the 3D NAND memory cell array 140 are located at the same side of the first substrate 110. The second wafer structure 200 includes a second substrate 210 and a sensing module 220 of a sensor M1. The sensing module 220 is integrated with the second substrate 210.

In some embodiments, the first substrate 110 and the second substrate 210 may respectively include a semiconductor substrate, such as a silicon substrate, a silicon-containing substrate, a III-V group-on-silicon substrate (such as a GaN-on-silicon substrate), a silicon-on-insulator (SOI) substrate, or other suitable substrates. In some embodiments, the integrated circuit layer 120 may be partly disposed in the first substrate 110 and partly disposed on the first substrate 110, and the 3D NAND memory cell array 140 may be disposed on the integrated circuit layer 120, but not limited thereto. In other words, at least a part of the integrated circuit layer 120 may be disposed between the 3D NAND memory cell array 140 and the first substrate 110 in a vertical direction Z, and the vertical direction Z may be regarded as a thickness direction of the first substrate 110 and/or a thickness direction of the second substrate 210.

As shown in FIG. 2 and FIGS. 4-6, a manufacturing method of the first wafer structure 100 may include but is not limited to the following steps. In step S111A, the first substrate 110 is provided. Subsequently, the integrated circuit layer 120 is formed on and integrated with the first substrate 110. As shown in FIG. 5, in some embodiments, the integrated circuit layer 120 may include a logic control module 124 of the sensor M1 and a buffer memory module 122. The buffer memory module 122 may include a static random-access memory (SRAM) module or other suitable types of buffer memory modules. In some embodiments, the logic control module 124 of the sensor M1 may include an image signal processing (ISP) module or other suitable types of logic control modules, and the sensor M1 may include a complementary metal-oxide-semiconductor (CMOS) image sensor (CIS) or other suitable types of image sensors. For example, the logic control module 124 may be an ISP module of a CIS device, but not limited thereto.

As shown in FIG. 5 and FIG. 6, in some embodiments, the integrated circuit layer 120 may further include a peripheral circuit 126. The peripheral circuit 126 and the 3D NAND memory cell array 140 subsequently formed on the integrated circuit layer 120 may constitute a 3D NAND memory module M2. In other words, the peripheral circuit 126 may be a peripheral circuit of the 3D NAND memory module M2. In some embodiments, the peripheral circuit 126 may include one or more of a page buffer, a decoder (e.g., a row decoder and a column decoder), a driver, a charge pump, a current or voltage reference, or any active or passive components required in the circuits (e.g., transistors, diodes, resistors, or capacitors).

As shown in FIG. 2, FIG. 4, and FIG. 5, in step S111B, the logic control module 124 of the sensor M1, the buffer memory module 122, and the peripheral circuit 126 may be formed on and/or integrated to the first substrate 110 for forming a system-on-a-chip (SoC) 130. In other words, the integrated circuit layer 120 and the first substrate 110 may constitute the SoC 130. In some embodiments, the integrated circuit layer 120 including the logic control module 124 of the sensor M1, the buffer memory module 122, and the peripheral circuit 126 may be formed by semiconductor manufacturing processes, such as film deposition processes, epitaxial growth processes, photolithography processes, implantation processes, thermal treatments, and/or other required processes. Preferably, advanced technology nodes of the semiconductor manufacturing process (such as 14 nm node and beyond) may be applied to form the integrated circuit layer 120 for improving the performance of each component in the integrated circuit layer 120 and controlling the dimension of the SoC 130.

As shown in FIG. 2, FIG. 5, and FIG. 6, in step S111C, the 3D NAND memory cell array 140 is formed on the SoC 130. In some embodiments, the 3D NAND memory cell array 140 may also be formed by semiconductor manufacturing processes, such as film deposition processes, epitaxial growth processes, photolithography processes, implantation processes, thermal treatments, and/or other required processes. In some embodiments, the 3D NAND memory cell array 140 may include a memory stack (not shown) and a plurality of memory strings (not shown), but not limited thereto. The memory stack may include conductor layers and dielectric layers disposed alternately in the vertical direction Z. In some embodiments, a memory film in each memory string may be a composite layer including a tunneling layer, a storage layer (also known as a "charge trap/storage layer"), and a blocking layer, but not limited thereto. Each of the memory strings may be elongated in the vertical direction Z and penetrate the memory stack, and the memory strings may be arranged in an array configuration for forming the memory cell array. It is worth noting that the 3D NAND memory cell array 140 is not limited to the structure described above and other suitable kinds of 3D NAND memory cell array structures may also be applied in the present disclosure. In some embodiments, the SoC 130 and the 3D NAND memory cell array 140 formed on the SoC 130 may be regarded as another SoC having functions of ISP, SRAM buffer memory, and 3D NAND memory with higher storage capacity. In the first wafer structure 100, the logic control module of the sensor, the SRAM buffer memory, the 3D NAND memory cell array, and the peripheral circuit of the 3D NAND memory are integrated on the same wafer.

Subsequently, as shown in FIG. 1 and FIG. 7, in step S120, the second wafer structure 200 is bonded to the first wafer structure 100. In some embodiments, the second wafer structure 200 may be bonded to the first wafer structure 100 by wafer-level 3D bonding/stacking technology, but not limited thereto. A side of the first wafer structure 100 where the 3D NAND memory cell array 140 is located is bonded to a side of the second wafer structure 200 where the sensing module 220 is located. Specifically, the first substrate 110 may have a first surface 110A and a second surface 110B opposite to the first surface 110A in the vertical direction Z, and the second substrate 210 may have a third surface 210A and a fourth surface 210B opposite to the third surface 210A in the vertical direction Z. The 3D NAND memory cell array 140 and the integrated circuit layer 120 may be disposed above the first surface 110A of the first substrate 110, and the sensing module 220 may be disposed on the third surface 210A of the second substrate 210. The third surface 210A of the second substrate 210 faces the first surface 110A of the first substrate 110 during the bonding process for bonding the second wafer structure 200 to the first wafer structure 100.

As shown in FIG. 3 and FIG. 7, a manufacturing method of the second wafer structure 200 may include but is not limited to the following steps. In step S112A, the second substrate 210 is provided. Subsequently, in step S112B, the sensing module 220 of the sensor M1 is integrated to the second substrate 210. In some embodiments, the sensing module 220 may be partly disposed in the second substrate 210 and partly disposed on the third surface 210A of the second substrate 210, but not limited thereto. In some embodiments, the sensor M1 may include an image sensor, such as a CIS or other suitable types of image sensors, and the sensing module 220 may include a pixel circuit module of the image sensor. For example, the sensing module 220 may include a pixel array of image sensing units in a CIS device, but not limited thereto.

As shown in FIG. 1 and FIG. 7, a sensor device 10 may be obtained by the manufacturing method described above. In some embodiments, the sensor device 10 may be regarded as a semi-finished product, and other post processes, such as a cutting process, a thinning process, and/or a packaging process may be performed for forming a sensor device with 3D bonding, but not limited thereto. In the present disclosure, there are only two wafer structures required to be bonded for forming the sensor device 10, and the manufacturing yield of the manufacturing process may be enhanced accordingly. The SRAM module, which may be formed by advanced technology nodes of the semiconductor manufacturing process, may be used to replace a DRAM memory module in a CIS device formed by a three wafer bonding approach. The additional 3D NAND memory module may provide higher storage capacity for the sensor device 10.

Additionally, as shown in FIG. 5 and FIG. 7, the buffer memory module 122 may be formed by advanced technology nodes of the semiconductor manufacturing process (such as 14 nm node and beyond) for reducing the occupied area on the first substrate 110 and/or increasing the storage capacity of the buffer memory module 122. The SoC 130 may be formed by advanced technology nodes of the semiconductor manufacturing process (such as 14 nm node and beyond) for improving the related performance, enhancing data processing speed, and/or reducing power consumption. The 3D NAND memory cell array 140 formed on the integrated circuit layer 120 may provide higher storage capacity without increasing a projection dimension of the first wafer structure 100 in the vertical direction Z because the storage capacity may be increased by forming more layers in the memory stack of the 3D NAND memory cell array 140. Therefore, the projection dimension of the first wafer structure 100 in the vertical direction Z may be controlled to be substantially equal to a projection dimension of the second wafer structure 200 in the vertical direction Z for realizing the wafer-level 3D bonding/stacking process, and the sensor device 10 having larger storage capacity and higher data processing speed may be obtained accordingly. In some embodiments, a projection dimension of the SoC 130 in the vertical direction Z may be equal to a projection dimension of the sensing module 220 of the sensor M1 in the vertical direction Z, but not limited thereto.

In some embodiments, the storage capacity of the sensor device 10 may be significantly higher than the storage capacity of a CIS device formed by a three wafer bonding approach. For example, the storage capacity of the CIS device formed by the three wafer bonding approach may be 1 Gb (128 MB). A dimension of a CIS chip (such as the second wafer structure 200 or at least a part of the second wafer structure 200) may be about 17.28 mm$^2$ (equal to 4.8 mm*3.6 mm). A storage density of a SRAM formed by the 14 nm node technology may be 1B/0.0588 μm$^2$, and a storage density of a 3D NAND memory module of 64 stacked layers may be 3.40 Gb/mm$^2$. According to the data described above, the storage capacity of the 3D NAND memory module having a dimension equal to a dimension of the CIS sensing module will be about 58.7 Gb, and an occupied area of the SRAM with 128 MB buffer capacity will be about 7.89 mm$^2$, and that is only 45% of the total area of the SoC 130. Additionally, the capacity of the buffer memory module and the storage module in the sensor device may be further increased by using more advanced technology nodes for forming the buffer memory module and forming the 3D NAND memory module including more stacked layers in the memory stack, but not limited thereto.

As shown in FIG. 7, the sensor device 10 includes the first wafer structure 100 and the second wafer structure 200. The first wafer structure 100 includes the first substrate, the integrated circuit layer 120, and the 3D NAND memory cell array 140. The integrated circuit layer 120 is integrated with the first substrate 110. The 3D NAND memory cell array 140 is integrated with the integrate circuit layer 120. The integrated circuit layer 120 and the 3D NAND memory cell array 140 are located at the same side of the first substrate 110. The second wafer structure 200 is bonded to the first wafer structure 100 by wafer-level 3D bonding/stacking technology. The second wafer structure 200 includes the second substrate 210 and the sensing module 220 of the sensor M1. The sensing module 220 is integrated with the second substrate 210, and the side of the first wafer structure 100 where the 3D NAND memory cell array 140 is located is bonded to the side of the second wafer structure 200 where the sensing module 220 is located.

As shown in FIG. 5 and FIG. 7, in some embodiments, the integrated circuit layer 120 may include the logic control module 124 of the sensor M1 and the buffer memory module 122. The buffer memory module 122 may include a SRAM module or other suitable types of buffer memory modules. In some embodiments, the logic control module 124 of the sensor M1 may include an ISP module or other suitable types of logic control modules, and the sensor M1 may include a CIS or other suitable types of image sensors. For example, the logic control module 124 may be an ISP module of a CIS device, and the sensing module 220 may include a pixel circuit module of the image sensor. In some embodiments, the sensing module 220 may include a pixel array of image sensing units in a CIS device, but not limited thereto. In some embodiments, the integrated circuit layer 120 may further include the peripheral circuit 126. The peripheral circuit 126 and the 3D NAND memory cell array 140 may constitute the 3D NAND memory module M2. In other words, the peripheral circuit 126 may be a peripheral circuit of the 3D NAND memory module M2. In some embodiments, the first substrate 110 and the integrated circuit layer 120 may constitute the SoC 130, and the 3D NAND memory cell array may be disposed on the SoC 130. In some embodiments, a bonding interface 300 between the first wafer structure 100 and the second wafer structure 200 may include a surface S1 of the 3D NAND memory cell array 140 and a surface S2 of the sensing module 220. In some embodiments, an adhesive material and a plurality of conductive structures may be used in the bonding interface 300, the 3D NAND memory cell array 140 may be electrically connected with the sensing module 220 via the conductive structures, and the components in the integrated circuit layer 120 (such as the logic control module 124 and the buffer memory module 122) may be electrically connected with the sensing module 220 via the 3D NAND memory cell array 140 and the conductive structures, but not limited thereto.

It is worth noting that the ISP module described above may be replaced by a logic control module of other kinds of sensor, and the pixel circuit module described above may be replaced by a sensing structure of the sensor. In other words, the chip design and the manufacturing method of the present disclosure may also be applied to form other sensor device with higher storage capacity and higher data processing speed.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 8:
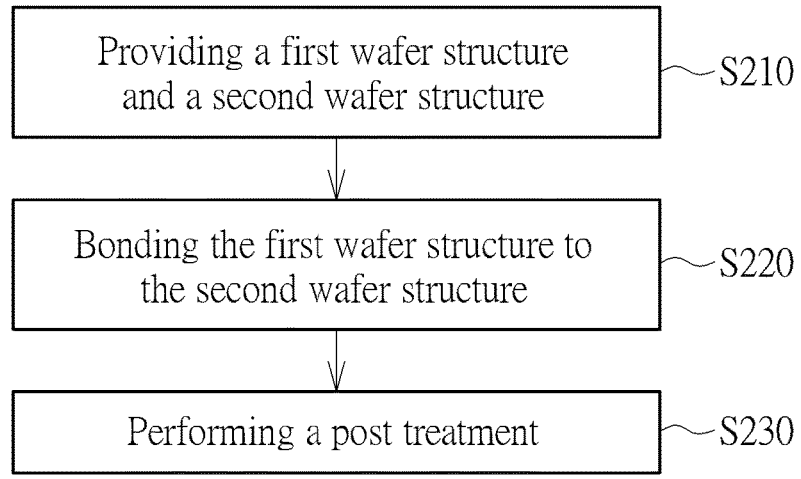
FIG. 8 is a flowchart of a manufacturing method of a sensor device according to a second embodiment of the present disclosure.
Figure 9:
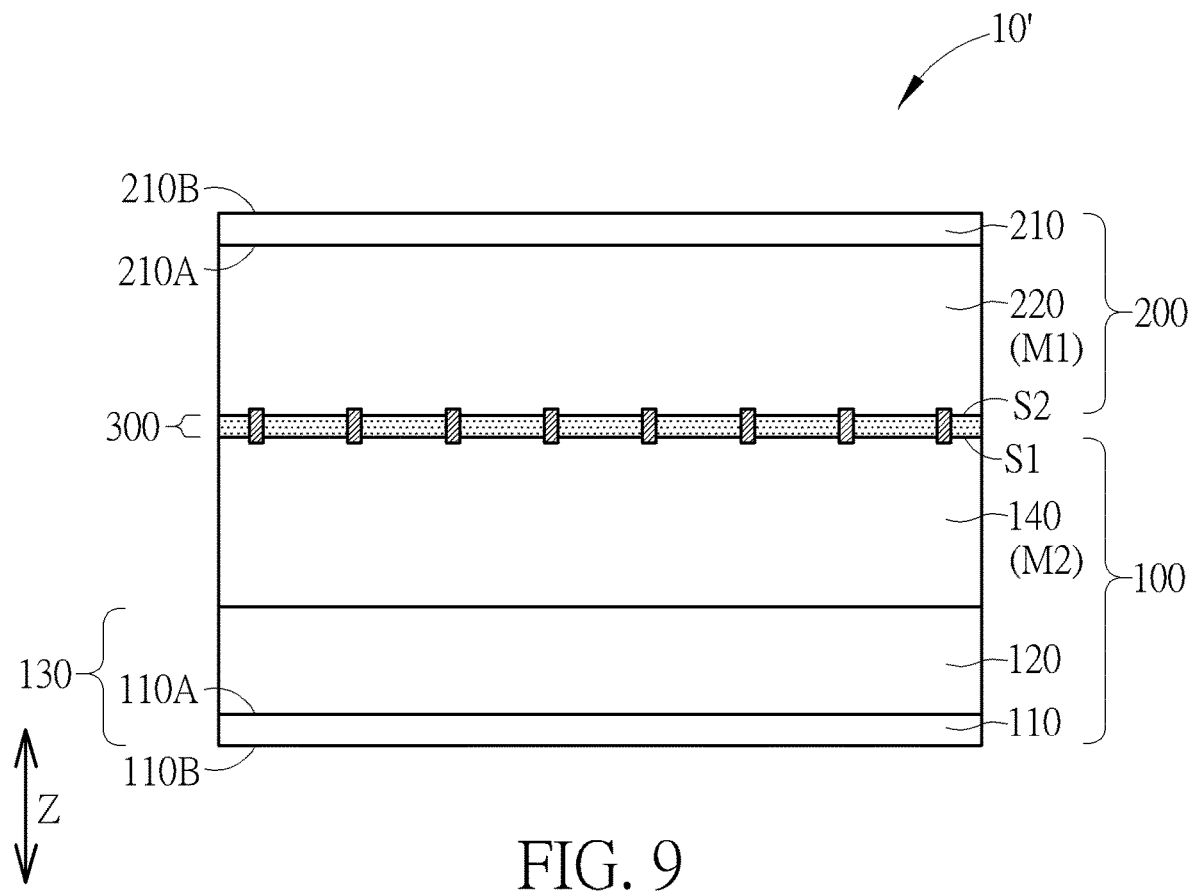
FIG. 9 is a schematic drawing illustrating a sensor device according to the second embodiment of the present disclosure.

Please refer to FIG. 8, FIG. 9, and FIG. 7. FIG. 8 is a flowchart of a manufacturing method of a sensor device according to a second embodiment of the present disclosure, and FIG. 9 is a schematic drawing illustrating a sensor device 10' in this embodiment. As shown in FIG. 7 and FIG. 8, the manufacturing method of the sensor device in this embodiment may include the following step. In step S210, the first wafer structure 100 and the second wafer structure 200 are provided. In step S220, the second wafer structure 200 is bonded to the first wafer structure 100. Subsequently, in step S230, a post treatment may be performed. The post treatment may be performed to the first wafer structure 100 bonded with the second wafer structure 200 for forming the sensor device 10' shown in FIG. 9. In some embodiments, the post treatment may include a cutting process, a thinning process, a packaging process, a test process, or other required treatments or processes. For example, in some embodiments, the first substrate 110 and/or the second substrate 210 may become thinner by the thinning process described above, but not limited thereto.

To summarize the above descriptions, in the sensor device and the manufacturing method thereof according to the present disclosure, there are only two wafer structures (instead of three or more wafers) required to be bonded for forming the sensor device by wafer-level 3D bonding/stacking technology, and the manufacturing yield of the manufacturing process may be enhanced accordingly. Additionally, the buffer memory module, which may be formed by advanced technology nodes of the semiconductor manufacturing process, may be used to replace a DRAM memory module in a CIS device formed by a three wafer bonding approach, and the additional 3D NAND memory module may provide higher storage capacity for the sensor device without increasing the projection dimension of the SoC. The sensor device having larger storage capacity and higher data processing speed may be obtained accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sensor device, comprising:
a first wafer structure, comprising:
   a first substrate;
   an integrated circuit layer integrated with the first substrate; and
   a three-dimensional (3D) NAND memory cell array integrated with the integrate circuit layer, wherein the integrated circuit layer and the 3D NAND memory cell array are located at the same side of the first substrate; and
a second wafer structure bonded to the first wafer structure, wherein the second wafer structure comprises:
   a second substrate; and
   a sensing module of a sensor, wherein the sensing module is integrated with the second substrate, and a side of the first wafer structure where the 3D NAND memory cell array is located is bonded to a side of the second wafer structure where the sensing module is located.

2. The sensor device according to claim 1, wherein the integrated circuit layer comprises:
a logic control module of the sensor; and
a buffer memory module.

3. The sensor device according to claim 2, wherein the buffer memory module comprises a static random-access memory (SRAM) module.

4. The sensor device according to claim 2, wherein the logic control module of the sensor comprises an image signal processing (ISP) module.

5. The sensor device according to claim 2, wherein the integrated circuit layer further comprises:
a peripheral circuit, wherein the peripheral circuit and the 3D NAND memory cell array constitute a 3D NAND memory module.

6. The sensor device according to claim 1, wherein the sensor comprises a complementary metal-oxide-semiconductor (CMOS) image sensor (CIS).

7. The sensor device according to claim 1, wherein the sensing module comprises a pixel circuit module.

8. The sensor device according to claim 1, wherein a bonding interface between the first wafer structure and the second wafer structure comprises a surface of the 3D NAND memory cell array and a surface of the sensing module.

9. The sensor device according to claim 1, wherein the first substrate and the integrated circuit layer constitute a system-on-a-chip (SoC), and the 3D NAND memory cell array is disposed on the SoC.

10. A manufacturing method of a sensor device, comprising:
providing a first wafer structure and a second wafer structure, wherein
   the first wafer structure comprises:
      a first substrate;
      an integrated circuit layer integrated with the first substrate; and
      a three-dimensional (3D) NAND memory cell array integrated with the integrate circuit layer, wherein the integrated circuit layer and the 3D NAND memory cell array are located at the same side of the first substrate; and
   the second wafer structure comprises:
      a second substrate; and
      a sensing module of a sensor, wherein the sensing module is integrated with the second substrate; and
bonding the second wafer structure to the first wafer structure, wherein a side of the first wafer structure where the 3D NAND memory cell array is located is bonded to a side of the second wafer structure where the sensing module is located.

11. The manufacturing method of the sensor device according to claim 10, wherein the integrated circuit layer comprises:
a logic control module of the sensor; and
a buffer memory module.

12. The manufacturing method of the sensor device according to claim 11, wherein the buffer memory module comprises a static random-access memory (SRAM) module.

13. The manufacturing method of the sensor device according to claim 11, wherein the logic control module of the sensor comprises an image signal processing (ISP) module.

14. The manufacturing method of the sensor device according to claim 11, wherein the integrated circuit layer further comprises:
  a peripheral circuit, wherein the peripheral circuit and the 3D NAND memory cell array constitute a 3D NAND memory module.

15. The manufacturing method of the sensor device according to claim 14, wherein a manufacturing method of the first wafer structure comprises:
  providing the first substrate;
  integrating the logic control module of the sensor, the buffer memory module, and the peripheral circuit to the first substrate for forming a system-on-a-chip (SoC), wherein the first substrate and the integrated circuit layer constitute the SoC; and
  forming the 3D NAND memory cell array on the SoC by a semiconductor manufacturing process.

16. The manufacturing method of the sensor device according to claim 15, wherein a projection dimension of the SoC in a vertical direction is equal to a projection dimension of the sensing module of the sensor in the vertical direction.

17. The manufacturing method of the sensor device according to claim 10, wherein the sensor comprises a complementary metal-oxide-semiconductor (CMOS) image sensor (CIS).

18. The manufacturing method of the sensor device according to claim 10, wherein the sensing module comprises a pixel circuit module.

19. The manufacturing method of the sensor device according to claim 10, wherein a bonding interface between the first wafer structure and the second wafer structure comprises a surface of the 3D NAND memory cell array and a surface of the sensing module.

20. The manufacturing method of the sensor device according to claim 10, further comprising:
  performing a post treatment to the first wafer structure bonded with the second wafer structure for forming the sensor device, wherein the post treatment comprises a cutting process or a thinning process.

* * * * *